United States Patent
Lee et al.

(10) Patent No.: US 6,867,995 B2
(45) Date of Patent: Mar. 15, 2005

(54) READ ONLY MEMORY CONFIGURATION TO REDUCE CAPACITANCE EFFECT BETWEEN NUMBERS OF BIT LINES

(75) Inventors: Yu-Wei Lee, Taichung (TW); Sheau-Yung Shyu, Hsinchu (TW); Chih-Hung Wu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/457,475

(22) Filed: Jun. 10, 2003

(65) Prior Publication Data

US 2003/0235065 A1 Dec. 25, 2003

(30) Foreign Application Priority Data

Jun. 20, 2002 (TW) .......................................... 9111483

(51) Int. Cl.⁷ .............................................. G11C 17/00
(52) U.S. Cl. ............... 365/94; 365/185.02; 365/185.05; 365/185.11; 365/185.13; 365/185.17; 365/103
(58) Field of Search ..................... 365/185.01, 185.02, 365/185.05, 185.11, 185.13, 185.17, 63, 94, 103, 189.01, 189.08, 230.03, 230.06

(56) References Cited

U.S. PATENT DOCUMENTS

| 5,341,337 | A | 8/1994 | Hotta |
| 6,278,649 | B1 * | 8/2001 | Lee et al. ............... 365/230.03 |
| 6,577,536 | B1 * | 6/2003 | Chung et al. .......... 365/185.11 |

* cited by examiner

Primary Examiner—VanThu Nguyen
(74) Attorney, Agent, or Firm—Rabin & Berdo, P.C.

(57) ABSTRACT

A read only memory device includes multiple word lines, a first and second main bit line GL (n) and BL (n), sub-bit lines SB1 (n) to SB4 (n), selection switches MB1 (n) to MB4 (n), and memory cells M1 (n) to M4 (n). The memory cells M1 (n) to M4 (n) are electrically coupled to the sub-bit lines SB1 (n) to SB4 (n) and the sub-bit line SB1 (n+1), respectively. When the memory cell M3 (n) which is connected to SB3 (n) is read, the sub-bit lines SB1 (n) to SB3 (n) are connected to the corresponding main bit lines through the turned selection switches. At this time, the sub-bit lines SB1 (n) to SB3 (n) are not floating but are all at the same high voltage level. Therefore, the capacitance effect will not exist between them to change the voltage level of the sub-bit lines quickly.

12 Claims, 6 Drawing Sheets

READ ONLY MEMORY CONFIGURATION TO REDUCE CAPACITANCE EFFECT BETWEEN NUMBERS OF BIT LINES

This application claims the benefit of Taiwan application Serial No. 91113483, filed Jun. 20, 2002.

BACKGROUND OF THE INVENTION

1. Field of the Invention

The present invention relates to a read only memory (ROM) device, and more particularly to a read only memory device with a reduced capacitance effect between a numbers of bit lines.

2. Description of the Related Art

U.S. Pat. No. 5,341,337 discloses the circuit architecture of a read only memory device, as shown in FIG. 1. Each of the bit lines Mb is electrically coupled to three bank selection MOSFETs BSO, respectively. The main bit lines, Mb1 to Mb4, can be electrically coupled to a sense amplifier, a ground voltage, or a pre-charge unit. This allows, for example, four continuous main bit lines from left to right to be electrically coupled to the pre-charge units PC1 and PC2, the sense amplifier SA, and the ground voltage terminal, respectively, during the reading of each of the memory cells M. That is, when memory cell M71 is to be read, main bit line Mb1 will be electrically coupled to the pre-charge unit PC1; the main bit line Mb2 will be electrically coupled to the pre-charge unit PC2; the main bit line Mb3 will be electrically coupled to the sense amplifier SA; and the main bit line Mb4 will be electrically coupled to the ground voltage terminal, wherein the pre-charge units PC1 and PC2 and the sense amplifier SA will cause the bit lines Mb to have high voltage.

At this time, the section selection line B02 will be enabled, causing transistors BSO2 and BSO7 to be turned on, thereby sub-bit lines SB3 and SB7 will change to high voltage levels. At the same time, the bank select line BE2 will be turned on, causing transistors BSE2, BSE3, BSE5, and BSE6 to be turned on, and thereby sub-bit line SB4 is converted to a high voltage level and sub-bit line SB8 is changed to the ground voltage. After word line WL1 is turned on, memory cell M71 will be turned on. As a result, the current will flow through sub-bit lines SB7 and SB8. By sensing the amount of current by the sense amplifier SA, the content of memory cell M71 can be read.

However, since transistors BSO4, BSO5, and BSE4 are not turned on, sub-bit lines SB5 and SB6 are floating. The floating sub-bit lines SB5 and SB6 will produce the capacitance effect with sub-bit lines SB4 and SB7, which currently are at a high voltage level. The capacitance effect produced by these floating sub-bit lines will increase the time needed to change the sub-bit line voltage levels. This situation will also cause a reduction in the operating speed for the entire read only memory device. As a result, the conventional read only memory circuit device is not suitable for use at high operating speeds.

SUMMARY OF THE INVENTION

It is therefore an objective of the present invention to provide a read only memory device, in which each memory bank uses four selection switches. By controlling the four selection switches, the memory device reading operation can thereby be controlled. The present invention can achieve several advantages: it resolves the conventional drawback of being incapable of fast switching due to the capacitance effect produced by the floating sub-bit lines; it simplifies the circuit layout and fabrication process; and it increases sensing performance.

In accordance with the foregoing and other objectives of the present invention, the invention provides a read only memory device, which includes multiple word lines positioned in parallel to each other. The read only memory device includes K sections. One of the K sections is an nth section. The nth section includes a first main bit line GL (n) and a second main bit line BL (n); a first selection line SL1 and a second selection line SL2; first, second, third, and fourth sub-bit lines, SB1 (n) to SB4 (n); multiple first, second, third, and fourth memory cells, M1 (n) to M4 (n); and first, second, third, and fourth selection switches, MB1 (n) to MB4 (n). The first main bit line GL (n) and the second main bit line BL (n) are perpendicular to the multiple word lines. The first selection line SL1 and the second selection line SL2 are parallel to the multiple word lines. The first, second, third, and fourth sub-bit lines, SB1 (n) to SB4 (n), are perpendicular to the multiple word lines. The first, second, third, and fourth memory cells, M1 (n) to M4 (n), are controlled by the multiple word lines. The first memory cell M1 (n) is electrically coupled to the first sub-bit line SB1 (n) and the second sub-bit line SB2 (n); the second memory cell M2 (n) is electrically coupled to the second sub-bit line SB2 (n) and the third sub-bit line SB3 (n); and the third memory cell M3 (n) is electrically coupled to the third sub-bit line SB3 (n) and the fourth sub-bit line SB4 (n). The fourth memory cell M4 (n) is electrically coupled to the fourth sub-bit line SB4 (n) and a first sub-bit line SB1 (n+1) of the $(n+1)^{th}$ section. The first and second selection switches MB1 (n) and MB2 (n) are controlled by the second selection line SL2. The third and fourth selection switches MB3 (n) and MB4 (n) are controlled by the first selection line SL1. One terminal of the first, second, third, and fourth selection switches, MB1 (n) to MB4 (n), is electrically coupled with the second main bit line BL (n). The other terminal of the first selection switch MB1 (n) is electrically coupled to the first sub-bit line SB1 (n). The other terminals of the second and third selection switches, MB2 (n) to MB3 (n), are electrically coupled to the third sub-bit line SB3 (n). The other terminal of the fourth selection switch MB4 (n) is electrically coupled to the first sub-bit line SB1 (n+1) of the $(n+1)^{th}$ section. The second and fourth sub-bit lines SB (2) and SB (4) are electrically coupled to the first main bit line GL (n).

In accordance with another objective of the present invention, the invention provides another read only memory device, which includes multiple word lines positioned in parallel to each other. The read only memory device includes K sections. One of the K sections is the nth section. The nth section includes a first main bit line GL (n); a second main bit line BL (n); first, second, third, and fourth sub-bit lines SB1 (n) to SB4 (n); first, second, third, and fourth selection switches MB1 (n) to MB4 (n); first and second selection lines SL1 and SL2; and multiple first, second, third, and fourth memory cells M1 (n) to M4 (n). The first, second, third, and fourth selection switches, MB1 (n) to MB4 (n), are electrically coupled to the second bit line. The other terminal of the first selection switch MB1 (n) is electrically coupled to the first sub-bit line SB1 (n). The other terminals of the second and third selection switches, MB2 (n) to MB3 (n), are electrically coupled to the third sub-bit line SB3 (n). The other terminal of the fourth selection switch MB4 (n) is electrically coupled to the first sub-bit line SB1 (n+1) of the $(n+1)^{th}$ section. In addition, the second and fourth sub-bit lines SB (2) and SB (4) are electrically coupled to the first main bit line GL (n). The first and second selection switches MB1 (n) and MB2 (n) are controlled by the second selection line SL2. Also, the third and fourth selection switches MB3 (n) and MB4 (n) are controlled by the first selection line SL1. And, multiple first, second, third, and fourth memory cells, M1 (n) to M4 (n), are controlled by the word lines. The multiple first, second, third, and fourth memory cells, M1 (n) to M4 (n), are electrically coupled in pairs to the first, second, third, and fourth sub-bit lines, SB1 (n) to SB4 (n), respectively, as well as a first sub-bit line SB1 (n+1) of the (n+1) section.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE INVENTION

Figure 1:
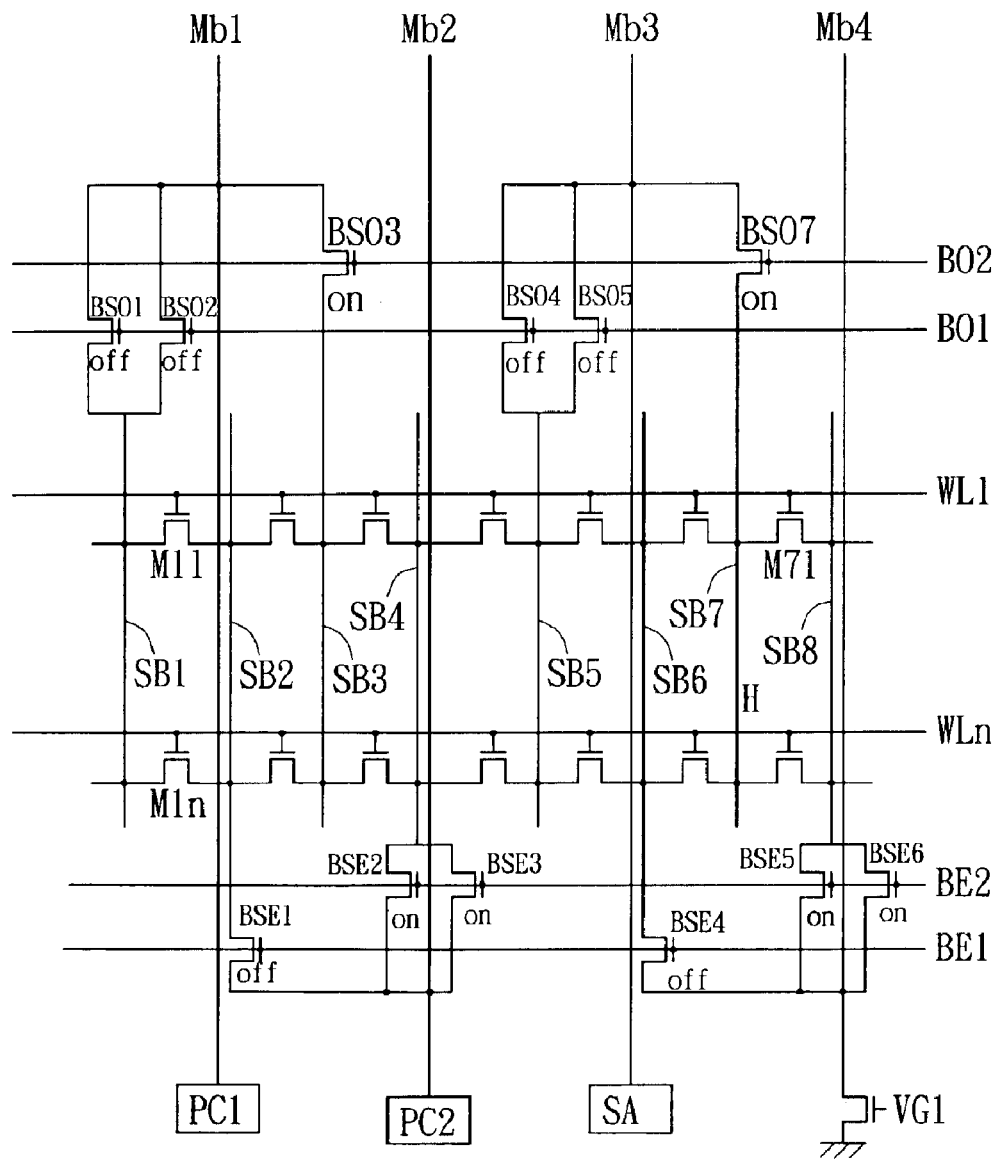
FIG. 1 is a drawing of a circuit diagram, schematically illustrating the circuit architecture of a read only memory device, as disclosed in U.S. Pat. No. 5,341,337.

The main feature of the present invention is that each of the main bit lines of the present invention is electrically coupled to four bank selection transistors MB. This method is different from the conventional circuit architecture shown in FIG. 1, in which each of the main bit lines Mb is electrically coupled to three bank selection transistors BSO.

First Embodiment

Figure 2:
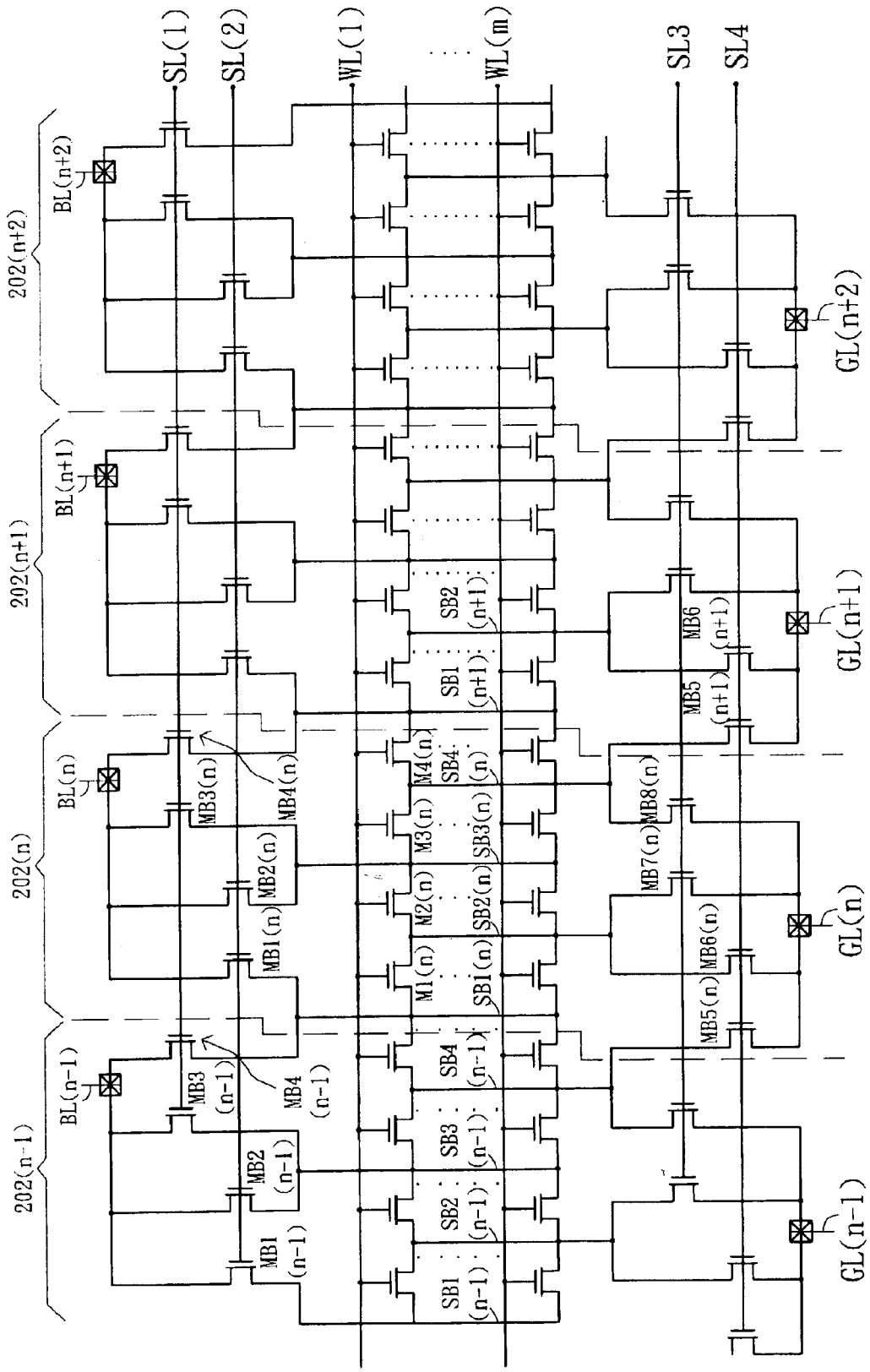
FIG. 2 is a drawing of a circuit diagram, schematically illustrating the circuit architecture of a read only memory (ROM) device, according to a first embodiment of the present invention.

FIG. 2 is a drawing of a circuit diagram, schematically illustrating the circuit architecture of a read only memory (ROM) device, according to a first embodiment of the present invention. The read only memory device of the present invention includes multiple word lines, WL (1) to WL (m), that are parallel to each other. The read only memory device also includes K sections, such as section 202 (n−1), 202 (n), 202 (n+1), and 202 (n+2), in which n is a positive integer and is less than K−2. Using the nth section 202 (n) as an example, in the nth section 202 (n), the first main bit line GL (n) and the second main bit line BL (n) are perpendicular to the multiple word lines WL (1) to WL (m). The first selection line SL1 and second selection line SL2 are parallel to the multiple word lines WL (1) to WL (m). Furthermore, multiple first, second, third, and fourth memory cells, M1 (n) to M4 (n), are controlled by the multiple word lines, WL (1) to WL (m), in which the first memory cell M1 (n) is electrically coupled to the first sub-bit line SB1 (n) and second sub-bit line SB2 (n). The second memory cell M2 (n) is electrically coupled to the second sub-bit line SB2 (n) and third sub-bit line SB3 (n). The third memory cell M3 (n) is electrically coupled to the third sub-bit line SB3 (n) and fourth sub-bit line SB4 (n). The fourth memory cell M4 (n) is electrically coupled to the fourth sub-bit line SB4 (n) and first sub-bit line SB1 (n+1) of the $(n+1)^{th}$ section 202 (n+1).

The read only memory device of the present invention further includes first, second, third, and fourth selection switches MB1 (n) to MB4 (n). The first and second selection switches MB1 (n) and MB2 (n) are controlled by the second selection line SL2, and the third and fourth selection switches MB3 (n) and MB4 (n) are controlled by the first selection line SL1, in which one terminal of each of the first, second, third, and fourth selection switches, MB1 (n) to MB4 (n), is electrically coupled to the second main bit line BL (n). The other terminal of the first selection switch MB1 (n) is electrically coupled to the first sub-bit line SB1 (n); the other terminal of each of the second and third selection switches MB2 (n) to MB3 (n) is electrically coupled to the third sub-bit line SB3 (n); and the other terminal of the fourth selection switch MB4 (n) is electrically coupled to the first sub-bit line SB1 (n+1) of the $(n+1)^{th}$ section 202 (n+1). Also, the second and fourth sub-bit lines SB (2) and SB (4) are electrically coupled to the first main bit line GL (n).

In addition, the nth section 202 (n) further includes third and fourth selection lines SL3 and SL4, as well as fifth, sixth, seventh, and eighth selection switches MB5 (n) to MB8 (n). The third and fourth selection lines SL3 and SL4 are parallel to the multiple word lines WL (1) to WL (m). The fifth and sixth selection switches MB5 (n) to MB6 (n) are controlled by the fourth selection line SL4, and the seventh and eighth selection switches MB7 (n) to MB8 (n) are controlled by the third selection line SL3. One terminal each of the fifth, sixth, seventh, and eighth selection switches, MB5 (n) to MB8 (n), is electrically coupled to the first main bit line GL (n). The other terminal of the fifth selection switch MB5 (n) is electrically coupled to the fourth sub-bit line SB4 (n−1) of the $(n−1)^{th}$ section 202 (n−1). The other terminal of each of the sixth and seventh selection switches MB6 (n) to MB7 (n) is electrically coupled to the second sub-bit line SB2 (n). And, the other terminal of the eighth selection switch MB8 (n) is electrically coupled to the fourth sub-bit line SB4 (n).

The procedures for the read only memory device circuit operation of the present invention are described as follows:

The first main bit line GL and the second main bit line BL can be electrically coupled to the sense amplifier SA, the ground voltage terminal GND, or the pre-charge circuit. In this manner, when the memory cell M is read, the four continuous main bit lines from left to right are then electrically coupled to the pre-charge units PC1 and PC2, the sense amplifier SA, and the ground voltage terminal GND, respectively, so as to read each one of the memory cells M.

Figure 3:
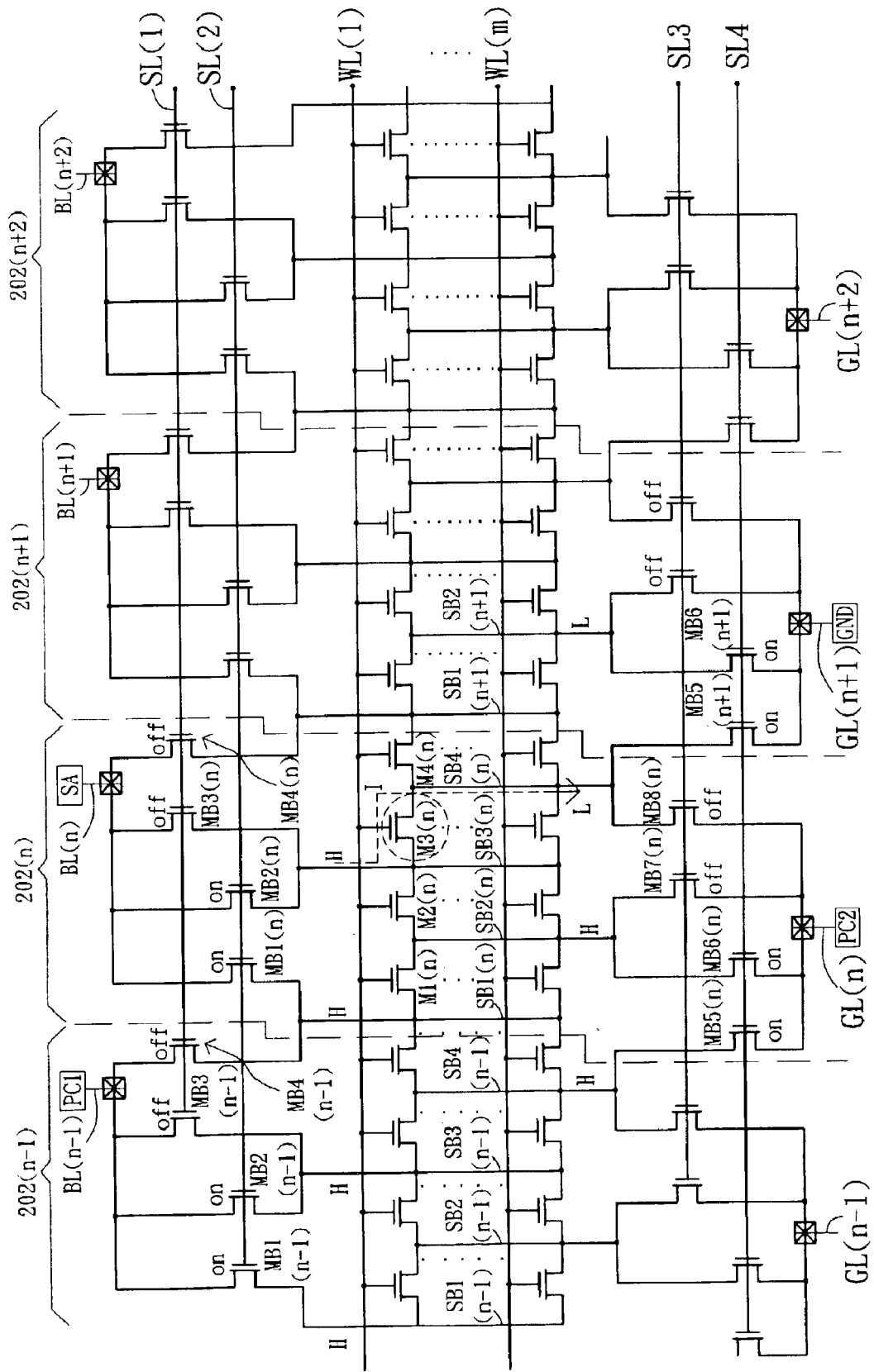
FIG. 3 is a drawing, schematically illustrating the current path when the third memory cell M3 (n) is to be read.

FIG. 3 illustrates how current flows while reading the third memory cell M3 (n), which is controlled by the WL (1), in the nth section 202 (n). When the third memory cell M3 (n) is to be read, the first main bit line GL (n+1) is electrically coupled to the ground voltage terminal GND; the second main bit line BL (n) is electrically coupled to a sense amplifier SA; the first main bit line GL (n) is electrically coupled to the pre-charge unit PC2; and the second main bit line BL (n−1) is electrically coupled to the pre-charge unit PC1. In this situation, the second selection line SL2 and the fourth selection line SL4 are enabled, thus causing the first selection switches MB1 (n−1) and MB1 (n); the second selection switches MB2 (n−1) and MB2 (n); the fifth selection switches MB5 (n) and MB5 (n+1); and the sixth selection switches MB6 (n) and MB6 (n+1) turned on. The sense amplifier SA will raise the voltage of the sub-bit lines SB1 (n) and SB3 (n) to a high voltage level H via the second main bit line BL (n). When the voltages of the sub-bit lines SB4 (n) and SB2 (n+1) are pull down to the ground voltage level L via the first main bit line GL (n+1), the pre-charge unit PC2 also raises the voltages of the sub-bit lines SB4 (n−1) and SB2 (n) up to a high voltage level H via the first main bit line GH (n). The pre-charge unit PC1 also raises the voltages of the sub-bit lines SB1 (n−1) and SB3 (n−1) up to a high voltage level H via the second main bit line BL (n−1).

When the word line WL1 is enabled, the memory cell M3 (n) is turned on. In this situation, the current from sense amplifier SA will flow to the ground voltage terminal GND through the second main bit line BL (n), the second selection switch MB2 (n), the third sub-bit line SB3 (n), the memory cell M3 (n), the fourth sub-bit line SB4, the fifth selection switch MB5 (n+1), and the first bit line GL (n+1). By sensing the amount of the current by the sense amplifier SA, the content of the memory cell M3 (n) can be read.

FIG. 3 shows that when the memory cell M3 (n) is read, the third sub-bit line SB3 (n) is at the high voltage level H. Based on the circuit architecture, the second sub-bit line SB2 (n), which is contiguous to the third sub-bit line SB3 (n), is also at the high voltage level H. In addition, the first sub-bit line SB1 (n), which is contiguous to the second sub-bit line SB2 (n), is also at the high voltage level H. Since a number of the sub-bit lines SB, which are contiguous to the third sub-bit line, are not floating but are all at the same high voltage level H, the capacitance effect will not exist between them. As a result, the present invention can effectively resolve a problem with conventional circuits, in that it usually takes longer to change the voltage level of the sub-bit lines because of the capacitance effect existing between the sub-bit lines. Therefore, the read only memory device of the present invention has a faster operating speed than that of a conventional read only memory device, which makes the read only memory device of the present invention particularly suitable for use in high speed operations.

At the same time, since the present invention can effectively resolve the capacitance effect problem, it improves the sensing performance of the memory cell M.

Figure 4:
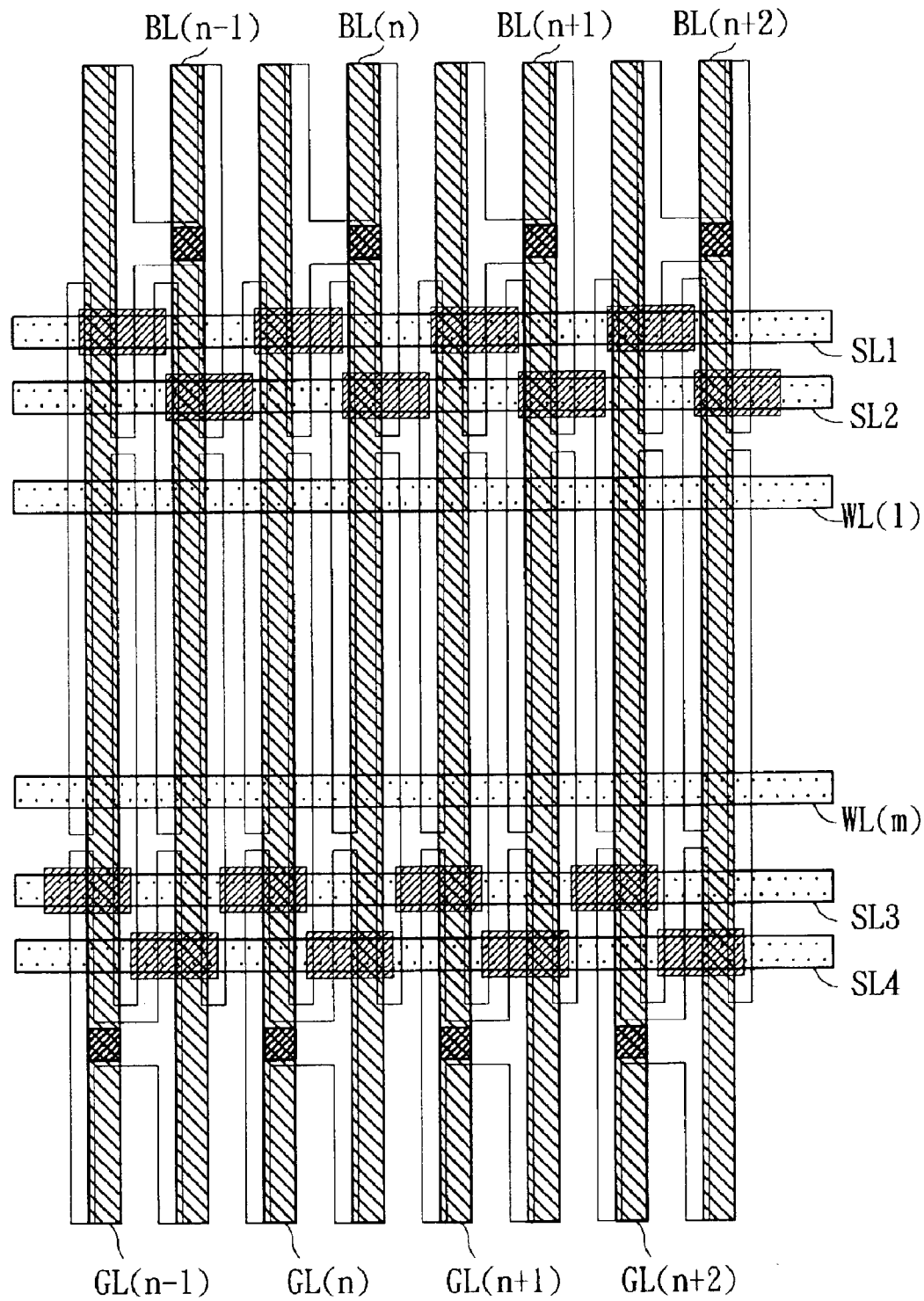
FIG. 4 is a drawing of a circuit diagram, schematically illustrating the circuit layout with respect to FIG. 3.

FIG. 4 is a drawing of a circuit diagram, schematically illustrating a circuit layout with respect to FIG. 3. According to FIG. 4, it can be seen that the layout of the circuit architecture in the present invention has the obvious advantage of simplifying circuit layout and the circuit fabrication process.

Furthermore, the present invention is particularly suitable for forming the main bit lines of read only memory devices that utilize a buried drain.

The Second Embodiment

In the first embodiment, the first main bit line GL and the second main bit line BL are electrically coupled to four selection switches MB at the same time in a symmetrical layout, in which the four selection switches MB are respectively controlled by 2 selection lines. However, the control method for the selection switches which are connected to the first main bit line and the control method of the selection switches which are connected to the second main bit line can be different. In other words, it is within the scope of the present invention to use the control method shown in FIG. 2 to control the four selection switches MB coupled to the first main bit line GL or to control the four selection switches MB coupled to the second main bit line BL.

Figure 5:
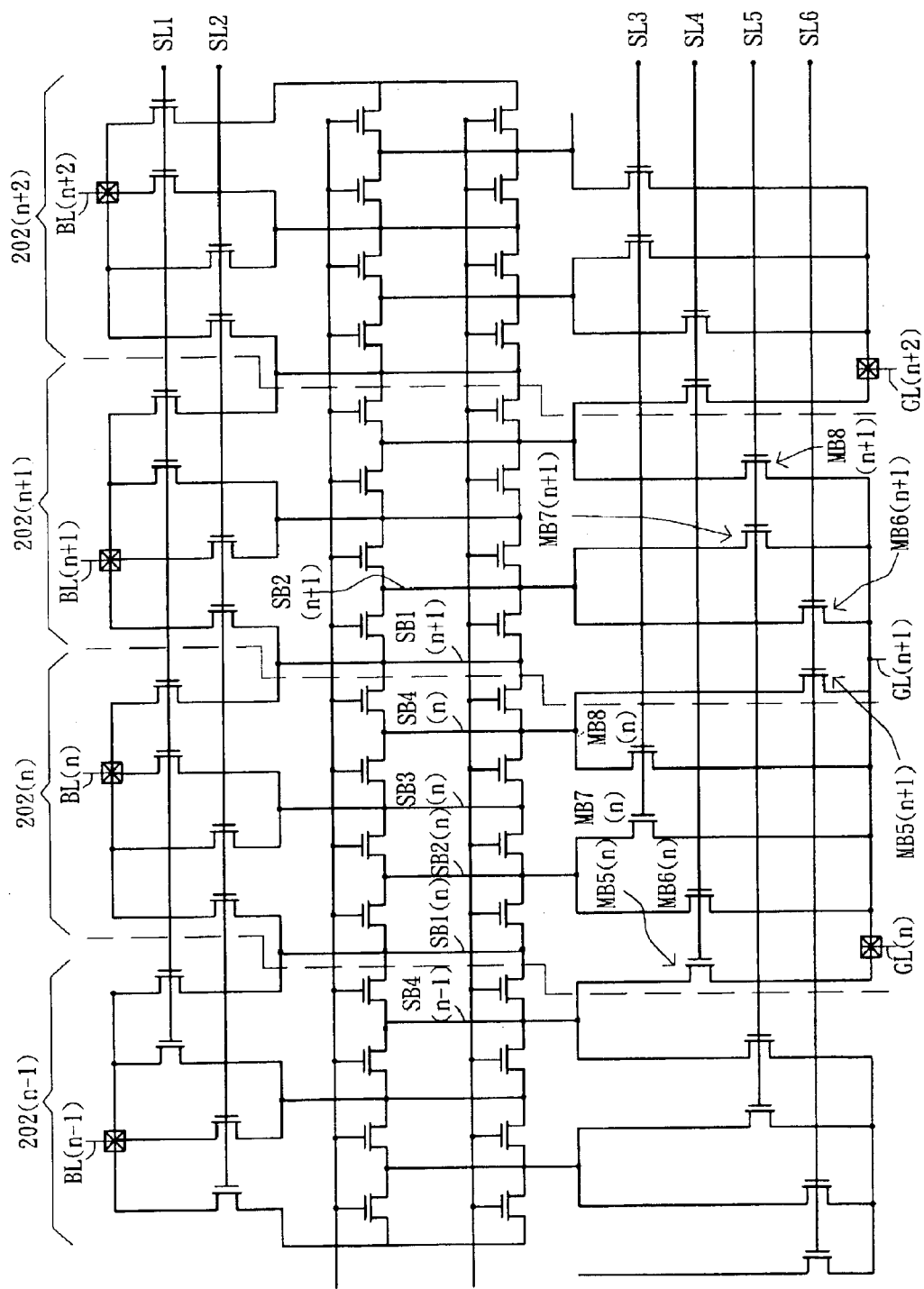
FIG. 5 is a drawing of a circuit diagram, schematically illustrating the circuit architecture of a read only memory device, according to a second embodiment of the present invention.

Referring to FIG. 5, it is a drawing of a circuit diagram, schematically illustrating the circuit architecture of a read only memory device, according to a second embodiment of the present invention. In the second embodiment, for example, a change in the method of controlling the four selection switches MB, which are electrically coupled to the first main bit line BL, is illustrated. The nth section 202 (n) includes the third, fourth, fifth, and sixth selection lines, SL3 to SL6, as well as the fifth, sixth, seventh, and eighth selection switches MB5 (n) to MB8 (n). The third, fourth, fifth, and sixth selection lines, SL3 to SL6, are parallel to the multiple word lines WL (1) to WL (m). The fifth and sixth selection switches MB5 (n) and MB6 (n) are controlled by the fourth selection line SL4. The seventh and eighth selection switches MB7 (n) and MB8 (n) are controlled by the third selection line SL3. Furthermore, the $(n+1)^{th}$ section 202 (n+1) also includes the fifth, sixth, seventh, and eighth selection switches MB5 (n+1) to MB8 (n+1). The fifth and sixth selection switches MB5 (n+1) and MB6 (n+1) are controlled by the sixth selection line SL6, and the seventh and eighth selection switches MB7 (n+1) and MB8 (n+1) are controlled by the fifth selection line SL5.

One terminal each of the fifth, sixth, seventh, and eighth selection switches, MB5 (n) to MB8 (n), is electrically coupled to the first main bit line GL (n). The other terminal of the fifth selection switch MB5 (n) is electrically coupled to the fourth sub-bit line SB4 (n−1) of the $(n-1)^{th}$ section 202 (n−1). The other terminal for each of the sixth and seventh selection switches MB6 (n) and MB7 (n) is electrically coupled to the second sub-bit line SB2 (n). The other terminal of the eighth selection switch MB8 (n) is electrically coupled to the fourth sub-bit line SB4 (n). The main bit lines GL (n) of sections 202 (n) and 202 (n+1) are electrically coupled to the main bit line GL (n+1).

The method of operation in the second embodiment of the present invention is similar to the first embodiment; the only difference between them is that when the memory device M belonging to different sections is intended to be selected, it is necessary to enable a different selection line. For example, when the memory device M with respect to the nth section 202 (n) is to be selected, it is necessary to enable the third selection line SL3 or the fourth selection line SL4. In another situation, when the memory device M with respect to the $(n+1)^{th}$ section 202 (n+1) is to be selected, it is necessary to enable the fifth selection line SL5 or the sixth selection line SL6.

Figure 6:
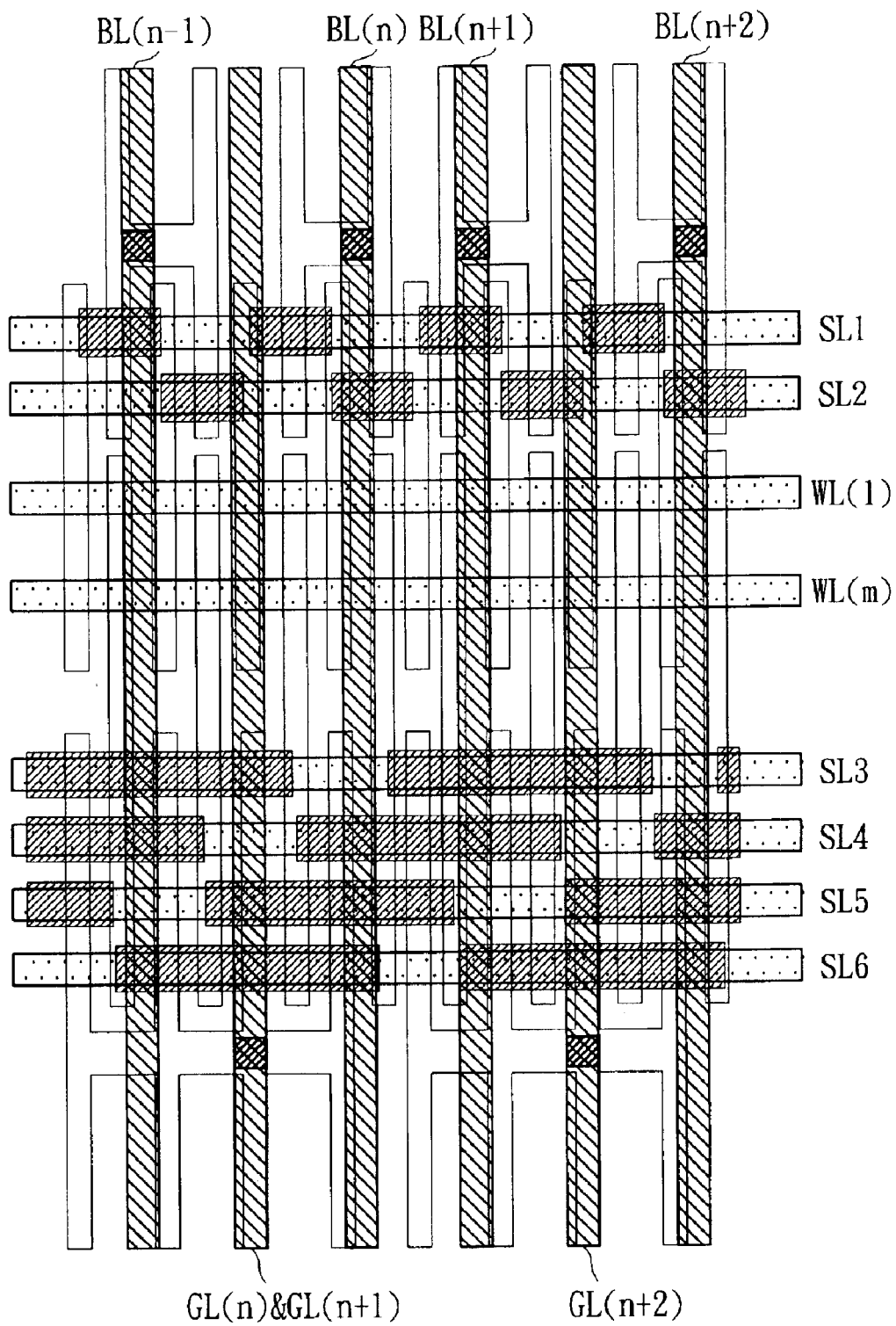
FIG. 6 is a drawing of a circuit diagram, schematically illustrating the circuit layout with respect to FIG. 5.

In addition, FIG. 6 is a drawing of a circuit diagram, schematically illustrating a circuit layout with respect to FIG. 5.

The second embodiment of the present invention can achieve similar advantages to the first embodiment shown in FIG. 2 of reducing the capacitance effect and increasing the operating speed of the read only memory device, effectively making the circuit layout simpler and the fabrication process easier.

In conclusion, the foregoing embodiments of the present invention have disclosed a read only memory device, in which by controlling the four selection switches with respect to each of the sections, the read operation on the memory cells can be controlled. The present invention can resolve a disadvantage of conventional circuit in which the situation created by the floating of sub-bit lines causes the capacitance effect, making fast switching impossible. A number of other advantages can be achieved, such as the circuit layout will be much simpler and the fabrication process will be easier.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A read only memory device, including a plurality of word lines, wherein the word lines are positioned in parallel to each other and the read only memory device includes K sections numbered 1 to K, for each of n=2 to K−1 three of the K sections being an (n−1)th section, an nth section and an (n−1)th section, the nth section comprising:

a first main bit line GL (n) and a second main bit line BL (n), which are perpendicular to the word lines;

a first selection line SL1 and a second selection line SL2, which are parallel to the word lines;

a first sub-bit line, a second sub-bit line, a third sub-bit line and a fourth sub-bit line, SB1 (n) to SB4 (n), which are perpendicular to the word lines;

a first plurality of memory cells, a second plurality of memory cells, a third plurality of memory cells, and a fourth plurality of memory cells, M1 (n) to M4 (n), which are controlled by the word lines, wherein the first memory cells M1 (n) are electrically coupled to the first sub-bit line SB1 (n) and second sub-bit line SB2 (n); the second memory cells M2 (n) are electrically coupled to the second sub-bit line SB2 (n) and third sub-bit line SB3 (n); the third memory cells M3 (n) are electrically coupled to the third sub-bit line SB3 (n) and fourth sub-bit line SB4 (n); the fourth memory cells M4 (n) are electrically coupled to the fourth sub-bit line SB4 (n) and a first sub-bit line SB1(n+1) of the (n+1)th section:

a first selection switch, a second selection switch, a third selection switch, and a fourth selection switch, MB1 (n) to MB4 (n), wherein the first and second selection switches MB1 (n) and MB2 (n) are controlled by the second selection line SL2, and the third and fourth selection switches MB3 (n) and MB4 (n) are controlled by the first selection line SL1;

a third selection line SL3 and a fourth selection line SL4, which are parallel to the word lines; and a fifth selection switch, a sixth selection switch, a seventh selection switch and an eighth selection switch, MB5 (n) to MB8 (n), wherein the fifth and sixth selection switches MB5 (n) to MB6 (n) are controlled by the fourth selection line SL4, and the seventh and eighth selection switches MB7 (n) to MB8 (n) are controlled by the third selection line SL3;

wherein one terminal of each of the first, second, third, and fourth selection switches, MB1 (n) to MB4 (n), is electrically coupled to the second main bit line BL (n); another one terminal of the first selection switch MB1 (n) is electrically coupled to the first sub-bit line SB1 (n); another one terminal of each of the second and third selection switches MB2 (n) to MB3 (n) is electrically coupled to the third sub-bit line SB3 (n); another one terminal of the fourth selection switch MB4 (n) is electrically coupled to the first sub-bit line SB1 (n+1) of the (n+1)th section; and the second and fourth sub-bit lines SB2 (n) and SB4 (n) are electrically coupled to the first main bit line GL (n);

wherein one terminal of each of the fifth, sixth, seventh, and eighth selection switches, MB5 (n) to MB8 (n), is electrically coupled to the first main bit line GL (n); another one terminal of the fifth selection switch MB5 (n) is electrically coupled to the fourth sub-bit line SB4 (n−1) of an (n−1)th section; another one terminal for each of the sixth and seventh selection switches MB6 (n) to MB7 (n) is electrically coupled to the second sub-bit line SB2 (n); and another one terminal of the eighth selection switch MB8 (n) is electrically coupled to the fourth sub-bit line SB4 (n).

2. The read only memory device as recited in claim 1, wherein the first main bit line GL (n) is formed by a buried drain.

3. The read only memory device as recited in claim 1, wherein the second main bit line BL (n) is formed by a buried drain.

4. A read only memory device, including a plurality of word lines, wherein the word lines are positioned in parallel to each other, the read only memory device includes K sections numbered 1 to K, and, for each of n=2 to K−1 three of the K sections being an (n−1)th section, an nth section and an (n−1)th section, the nth section comprising:

a first main bit line GL (n) and a second main bit line BL (n), which are perpendicular to the word lines;

a first selection line SL1 and a second selection line SL2, which are parallel to the word lines;

a first sub-bit line, a second sub-bit line, a third sub-bit line, and a fourth sub-bit line, SB1 (n) to SB4 (n), which are perpendicular to the word lines;

a first plurality of memory cells, a second plurality of memory cells, a third plurality of memory cells, and a fourth plurality of memory cells, M1 (n) to M4 (n), which are controlled by the word lines, wherein the first memory cells M1 (n) are electrically coupled to the first sub-bit line SB1 (n) and second sub-bit line SB2 (n); the second memory cells M2 (n) are electrically coupled to the second sub-bit line SB2 (n) and third sub-bit line SB3 (n); the third memory cells M3 (n) are electrically coupled to the third sub-bit line SB3 (n) and fourth sub-bit line SB4 (n); the fourth memory cells M4 (n) are electrically coupled to the fourth sub-bit line SB4 (n) and a first sub-bit line SB1(n+1) of a (n+1)th section; and a first selection switch, a second selection switch, a third selection switch, and a fourth selection switch, MB1 (n) to MB4 (n), wherein the first and second selection switches MB1 (n) and MB2 (n) are controlled by the second selection line SL2, and the third and fourth selection switches MB3 (n) and MB4 (n) are controlled by the first selection line SL1;

the nth section and the (n+1)$^{th}$ section further comprising:

a third selection line, a fourth selection line, a fifth selection line, and a sixth selection line, SL3 to SL6, which are parallel to the word lines; and a fifth selection switch, a sixth selection switch, a seventh selection switch, and an eighth selection switch, MB5 (n) to MB8 (n), belonging to the nth section, and a fifth selection switch, a sixth selection switch, a seventh selection switch, and an eighth selection switch, MB5 (n+1) to MB8 (n+1), belonging to the (n+1)th section, wherein the fifth and sixth selection switches MB5 (n) and MB6 (n) are controlled by the fourth selection line SL4; the seventh and eighth selection switches MB7 (n) to MB8 (n) are controlled by the third selection line SL3; the fifth and sixth selection switches MB5 (n+1) and MB6 (n+1) are controlled by the sixth selection line SL6; and the seventh and eighth selection switches MB7 (n+1) to MB8 (n+1) are controlled by the fifth selection line SL5, wherein one terminal of each of the first, second, third, and fourth selection switches, MB1 (n) to MB4 (n), is electrically coupled to the second main bit line BL (n); another one terminal of the first selection switch MB1 (n) is electrically coupled to the first sub-bit line SB1 (n); another one terminal of each of the second and third selection switches MB2 (n) to MB3 (n) is electrically coupled to the third sub-bit line SB3 (n); another one terminal of the fourth selection switch MB4 (n) is electrically coupled to the first sub-bit line SB1 (n+1) of the (n+1)th section; and the second and fourth sub-bit lines SB2 (n) and SB4 (n) are electrically coupled to the first main bit line GL (n);

wherein one terminal of each of the fifth, sixth, seventh, and eighth selection switches, MB5 (n) to MB8 (n), is electrically coupled to the first main bit line GL (n); another one terminal of the fifth selection switch MB5 (n) is electrically coupled to a fourth sub-bit line SB4 (n−1)of a (n−1)th section; another one terminal for each of the sixth and seventh selection switches MB6 (n) to MB7 (n) is electrically coupled to the second sub-bit line SB2 (n); and another one terminal of the eighth selection switch MB8 (n) is electrically coupled to the fourth sub-bit line SB4 (n); and wherein the first main bit line GL (n) and the first main bit line GL (n+1) are electrically coupled together.

5. The read only memory device as recited in claim 4, wherein the first main bit line GL (n) is formed by a buried drain.

6. The read only memory device as recited in claim 4, wherein the second main bit line BL (n) is formed by a buried drain.

7. A read only memory device, including a plurality of word lines, wherein the word lines are positioned in parallel to each other; the read only memory device includes K sections numbered 1 to K; and for each of n=2 to K−1 three of the K sections being an (n−1)th section, an nth section and an (n+1)th section, the nth section comprising:

a first main bit line GL (n), a second main bit line BL (n), and a first sub-bit line, a second sub-bit line, a third sub-bit line, and a fourth sub-bit line SB1 (n) to SB4 (n);

a first selection switch, a second selection switch, a third selection switch, and a fourth selection switch, MB1 (n) to MB4 (n), all of which are electrically coupled to the second bit line, wherein another one terminal of the first selection switch MB1 (n) is electrically coupled to the first sub-bit line SB1 (n); another one terminal of each of the second and third selection switches MB2 (n) to MB3 (n) is electrically coupled to the third sub-bit line SB3 (n); and another one terminal of the fourth selection switch MB4 (n) is electrically coupled to the first sub-bit line SB1 (n+1) of the (n+1)th section; and wherein the second and fourth sub-bit lines SB (2) and SB (4) are electrically coupled to the first main bit line GL (n);

a first selection line SL1 and a second selection line SL2, wherein the first and second selection switches MB1 (n) and MB2 (n) are controlled by the second selection line SL2, and the third and fourth selection switches are controlled by the first selection line SL1;

a first plurality of memory cells, a second plurality of memory cells, a third plurality of memory cells, and a fourth plurality of memory cells, M1 (n) to M4 (n), which are controlled by the word lines; the first, second, third, and fourth memory cells, M1 (n) to M4 (n), are electrically coupled in pairs to the first, second, third, and fourth sub-bit lines SB1 (n) to SB4 (n), respectively, as well as to a first sub-bit line SB1 (n+1) of the (n+1)th section;

a selection line SL3 and a fourth selection line SL4; and a fifth selection switch, a sixth selection switch, a seventh selection switch, and an eighth selection switch, MB5 (n) to MB8 (n), wherein the fifth and sixth selection switches MB5 (n) and MB6 (n) are controlled by the fourth selection line SL4, and the seventh and eighth selection switches MB7 (n) to MB8 (n) are controlled by the third selection line SL3; wherein one terminal of each of the fifth, sixth, seventh, and eighth selection switches, MB5 (n) to MB8 (n), is electrically coupled to the first sub-bit line GL (n); another one terminal of the fifth selection switch MB5 (n) is electrically coupled to a fourth sub-bit line SB4 (n−1) of a (n−1)th section; another one terminal of each of the sixth and seventh selection switches MB6 (n) and MB7 (n) is electrically coupled to the second sub-bit line SB2 (n); and another one terminal of the eighth selection switch MB8 (n) is electrically coupled to the fourth sub-bit line SB4 (n).

8. The read only memory device as recited in claim 7, wherein the first main bit line GL (n) is formed by a buried drain.

9. The read only memory device as recited in claim 7, wherein the second main bit line BL (n) is formed by a buried drain.

10. A read only memory device, including a plurality of word lines, wherein the word lines are positioned in parallel to each other; the read only memory device includes K sections numbered 1 to K; and for each of n=2 to K−1 three of the K sections being an (n−1)th section, an nth section and an (n+1)th section, the nth section comprising:

a first main bit line GL (n), a second main bit line BL (n), and a first sub-bit line, a second sub-bit line, a third sub-bit line, and a fourth sub-bit line, SB1 (n) to SB4 (n);

a first selection switch, a second selection switch, a third selection switch, and a fourth selection switch, MB1 (n) to MB4 (n), all of which are electrically coupled to the second bit line, wherein another one terminal of the first selection switch MB1 (n) is electrically coupled to the first sub-bit line SB1 (n); another one terminal of each of the second and third selection switches MB2 (n) to MB3 (n) is electrically coupled to the third sub-bit line SB3 (n); and another one terminal of the fourth selection switch MB4 (n) is electrically coupled to the first sub-bit line SB1 (n+1) of the (n+1)th section; wherein the second and fourth sub-bit lines SB (2) and SB (4) are electrically coupled to the first main bit line GL (n);

a first selection line SL1 and a second selection line SL2, wherein the first and second selection switches MB1 (n) and MB2 (n) are controlled by the second selection line SL2, and the third and fourth selection switches are controlled by the first selection line SL1; and a first plurality of memory cells, a second plurality of memory cells, a third plurality of memory cells, and a fourth plurality of memory cells, M1 (n) to M4 (n), which are controlled by the word lines; the first, second, third, and fourth memory cells, M1 (n) to M4 (n), are electrically coupled in pairs to the first, second, third, and fourth sub-bit lines SB1 (n) to SB4 (n), respectively, as well as to a first sub-bit line SB1 (n+1) of the (n+1)th section;

the nth section and the (n+1)$^{th}$ section further comprising:

a third selection line, a fourth selection line, a fifth selection line, and a sixth selection line, SL3 to SL6; and a fifth selection switch, a sixth selection switch, a seventh selection switch, and an eighth selection switch, MB5 (n) to MB8 (n), belonging to the nth section, and a fifth selection switch, a sixth selection switch, a seventh selection switch, and an eighth selection switch, MB5 (n+1) to MB8 (n+1) belonging to the (n+1)th section, wherein the fifth and sixth selection switches MB5 (n) and MB6 (n) are controlled by the fourth selection line SL4; the seventh and eighth selection switches MB7 (n) to MB8 (n) are controlled by the third selection line SL3; the fifth and sixth selection switches MB5 (n+1) to MB6 (n+1) are controlled by the sixth selection line SL6; and the seventh and eighth selection switches MB7 (n+1) to MB8 (n+1) are controlled by the fifth selection line SL5, wherein one terminal for each of the fifth, sixth, seventh, and eighth selection switches MB5 (n) to MB8 (n) is electrically coupled to the first main bit line GL (n); another one terminal of the fifth selection switch MB5 (n) is electrically coupled to a fourth sub-bit line SB4 (n−1) of a (n−1)th section; another one terminal for each of the sixth and seventh selection switches MB6 (n) to MB7 (n) is electrically coupled to the second sub-bit line SB2 (n); another one terminal of the eighth selection switch MB8 (n) is electrically coupled to the fourth sub-bit line SB4 (n); and the first main bit line GL (n) is electrically coupled to the first main bit line GL (n+1).

11. The read only memory device as recited in claim 10, wherein the first main bit line GL (n) is formed by a buried drain.

12. The read only memory device as recited in claim 10, wherein the second main bit line BL (n) is formed by a buried drain.

* * * * *